(12) United States Patent
Meholensky et al.

(10) Patent No.: US 8,975,969 B1
(45) Date of Patent: Mar. 10, 2015

(54) CONTROL SYSTEM WITH BOTH FAST SAMPLE TIME AND LONG GATE TIME

(71) Applicants: Michael C. Meholensky, Marion, IA (US); Vadim Olen, Cedar Rapids, IA (US); Adrian A. Hill, Vinton, IA (US); Paul L. Opsahl, Cedar Rapids, IA (US)

(72) Inventors: Michael C. Meholensky, Marion, IA (US); Vadim Olen, Cedar Rapids, IA (US); Adrian A. Hill, Vinton, IA (US); Paul L. Opsahl, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 67 days.

(21) Appl. No.: 13/746,714

(22) Filed: Jan. 22, 2013

(51) Int. Cl.
*H03L 7/091* (2006.01)
*H03B 5/32* (2006.01)
*H03L 1/02* (2006.01)
*H03L 7/06* (2006.01)

(52) U.S. Cl.
CPC ..................................... *H03L 7/06* (2013.01)
USPC ................. 331/18; 331/25; 331/47; 331/158; 331/162; 331/176

(58) Field of Classification Search
USPC ............ 327/147, 156; 331/17, 18, 25, 34, 47, 331/48, 158, 162, 176; 375/373, 375, 376
See application file for complete search history.

(56) References Cited

U.S. PATENT DOCUMENTS

| | | | | |
|---|---|---|---|---|
| 3,395,361 A * | 7/1968 | Brauer | ............................ | 331/14 |
| 4,297,657 A * | 10/1981 | Frerking | ........................ | 331/176 |
| 4,325,036 A * | 4/1982 | Kuwabara | ...................... | 331/176 |
| 4,513,259 A * | 4/1985 | Frerking | ........................ | 331/176 |
| 7,395,175 B2 * | 7/2008 | Yamauchi et al. | ............. | 702/130 |
| 8,643,440 B2 * | 2/2014 | Kondo et al. | .................... | 331/46 |
| 2013/0147529 A1 * | 6/2013 | Ganesan et al. | ............... | 327/156 |

* cited by examiner

*Primary Examiner* — Levi Gannon
(74) *Attorney, Agent, or Firm* — Angel N. Gerdzhikov; Donna P. Suchy; Daniel M. Barbieri

(57) ABSTRACT

Disclosed are control systems, and more specifically control systems which benefit from a long-gate time for measurement and a rapid sample time to enhance responsiveness and methods and systems for utilizing multiple-staggered, overlapping gates where the gate time is an integer multiple of the time between ends of adjacent gates. The system continuously counts at the wavefronts or zero-crossings of a frequency reference signal and temporarily records them in registers and compares the contents of registers separated by a gate time and outputs a sample after every sample time.

6 Claims, 2 Drawing Sheets

CONTROL SYSTEM WITH BOTH FAST SAMPLE TIME AND LONG GATE TIME

FIELD OF THE INVENTION

The present invention relates to control systems, and more specifically to control systems which benefit from a long gate time for measurement and a rapid sample time.

BACKGROUND OF THE INVENTION

In the past, Reference Frequency Generating devices, or Frequency References, have been critical to the operation of most communication, navigation, and Electronic Warfare products. These frequency references are used to provide stable frequency reference for RF communication and provide stable time base for timing critical applications, such as GPS.

Most frequency references are designed to maintain accuracy over temperature by either controlling temperature (i.e. operate in an ovenized environment) or by compensating for temperature (using a control loop).

In many controlled crystal oscillators that utilize a control loop, a fast reaction time is needed to be able to track rapidly-changing temperature changes. To have a fast reaction time, the sample time, or the time it takes to have the next sample for a digital system, needs to be short. However, to minimize quantization error in a frequency measurement, the gate time, or the time it takes to perform the measurement, needs to be long. In a high accuracy frequency reference that is temperature compensated, there needs to be a short sample time to track errors, but a long gate time to make measurements accurate enough to correct for errors. In current state-of-the-art reference frequency generating devices that use temperature compensation (e.g.—Microcontroller Compensated Crystal Oscillators or "MCXOs") Sample Time and Gate Time are the same value: i.e., one frequency measurement per one sample time and one frequency measurement in one gate time.

The sample time/gate time of these devices is chosen as a design tradeoff.

A longer frequency measurement could be used if more accuracy is needed, and a shorter frequency measurement might be used if a more rapid response is needed (fast temperature deviations).

It has also been known in the past to use MCXOs that employ some microprocessor predictive control, and these have enjoyed considerable success. Some prior art products (e.g. Rockwell Collins (Cedar Rapids, Iowa USA) TCCOs (277-0741-0X0, 277-0751-0X0, 277-0728-0X0; 10+total)) use a "look-ahead" function that can preempt temperature changes while keeping longer gate times for more accurate measurements. These "look-ahead" functions are limited to working with temperature deviations at a specific rate and in a specific direction (i.e., temperature going hot to cold or cold to hot).

However, in many applications, very small-sampled times are needed to provide very rapidly-changing controls.

The present invention overcomes some long-standing problems associated with rapid control of frequency references, especially when long gate times are needed to provide a high level of confidence in the validity of the measurement.

SUMMARY OF THE INVENTION

It is an object of the present invention to provide control systems and methods for improved control of systems which require an extended gate time for making accurate measurements, combined with a need for a highly-responsive or fast-reacting system.

It is a feature of the present invention to include a scheme of overlapping gates where the time between terminal ends of each adjacent gate is the sample time.

It is an advantage of the present invention to allow for gate times of sufficient duration that reliable measurements can be made during each gate time.

It is another feature of the present invention to include an independent temperature-compensated crystal oscillator to facilitate gate duration and timing.

It is another advantage of the present invention to provide for the accurate gate generation in environments with variable temperatures.

The present invention is a method and apparatus for controlling a system, which is designed to satisfy the aforementioned needs, provide the previously stated objects, include the above-listed features, and achieve the already articulated advantages.

Accordingly, the present invention is a method of controlling a system comprising the steps of:
  a. Providing an input signal to be analyzed;
  b. Determining a desired sample time which is the time between successive sample outputs;
  c. Determining a desired gate time which is an integer multiple of the sample time;
  d. Making periodic measurements of said input signal which are separated in time by the sample time;
  e. Making a comparison after every measurement of said input signal to a previous measurement of said input signal that was measured at one gate time previously and generating a report which is representative of said comparison; and
Using said report to control a parameter of a system.

DETAILED DESCRIPTION

Figure 1:
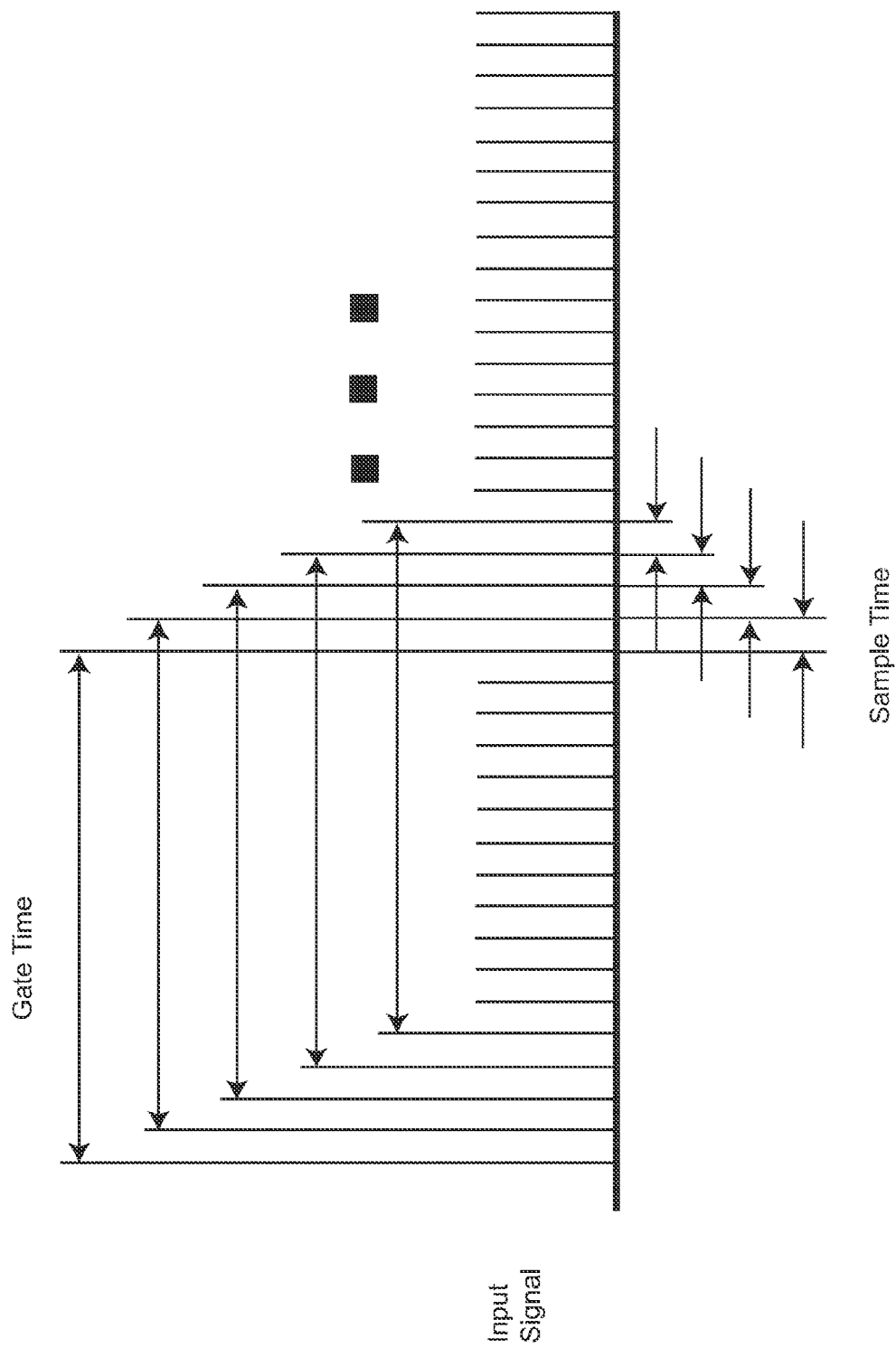
FIG. 1 shows a graphical representation of the overlapping gate times of the present invention.

Now referring to the drawings, wherein like numerals refer to like matter throughout, and more particularly, referring to FIG. 1, there is shown a graphical representation of a fundamental aspect of the present invention, namely the repeated sampling of an input signal (which could be any signal including, but not limited to an output signal of a frequency reference) over a predetermined Gate Time (GT). Since there are overlapping gates (each of an identical duration), the Sample Time (ST) is the time between ending of successive GTs; so a measurement of the Input Signal is reported out of the control system once every ST. For example, the system could be implemented as simple as a wavefront counter that reports out its ever-increasing current count every $1/100^{th}$ of a second; so if the Input Signal is a 10 MHz signal, and the sample time is $1/100^{th}$ of a second, then the system would simply analyze the Input Signal by merely counting the approximately 100,000 wavefronts or 200,000 zero crossings per ST. In such situations, it would be important that the timing of each wavefront count be extremely accurate.

Figure 2:
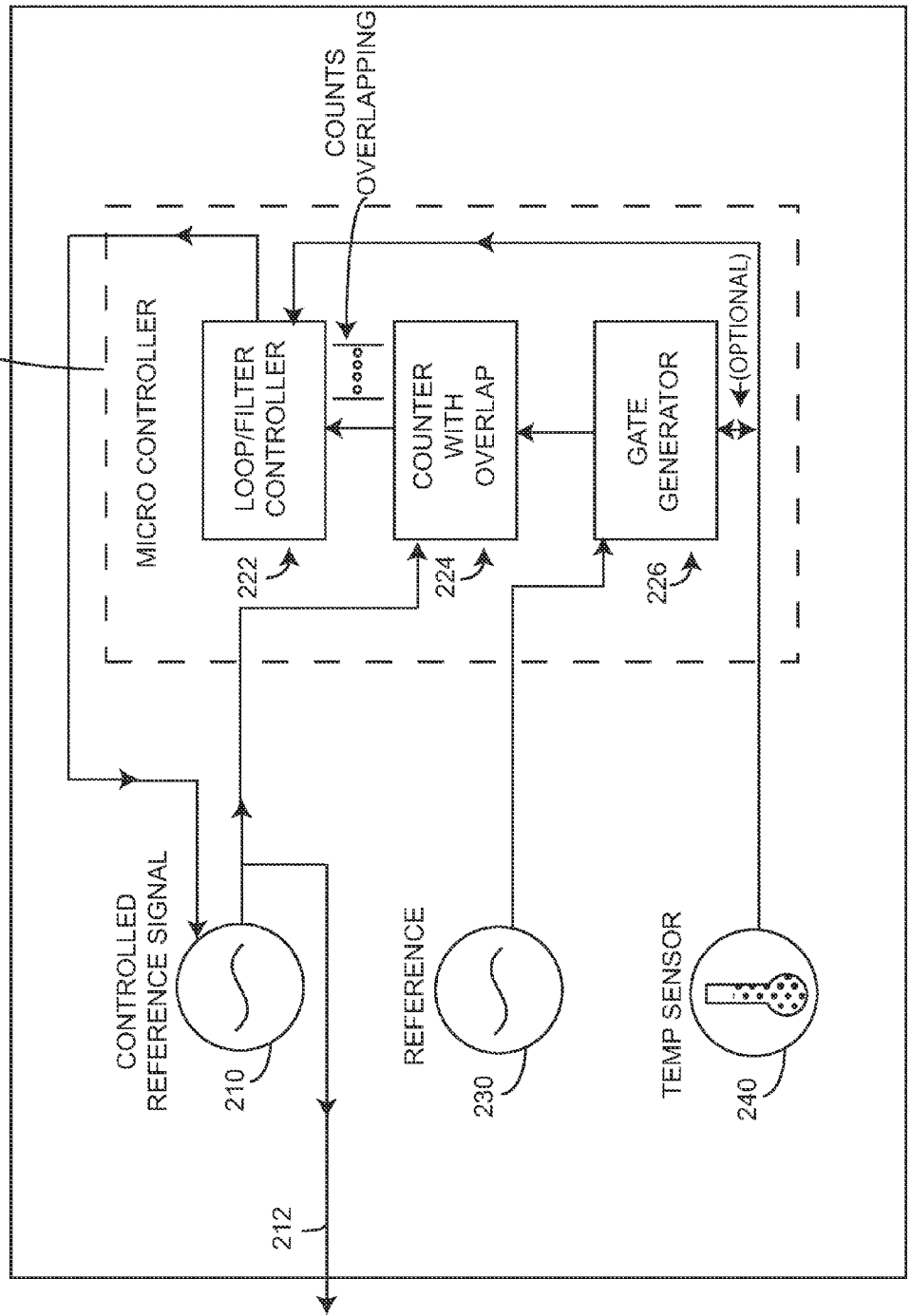
FIG. 2 shows a block diagram of a frequency reference controlled by the overlapping gate control system of the present invention.

The present invention may be better understood by now referring to FIG. 2, where there is a representative system of the present invention for carrying out the overlapping gate time method of the present invention. There is shown a frequency reference, generally designated 200, which includes a controlled VCXO 210, a reference crystal oscillator 230, a temperature sensor 240 and a microcontroller 220.

The reference crystal oscillator 230 may be an oscillator with well-documented performance over temperature. This documentation may be stored in a Look-Up Table coupled to, or otherwise associated with, microcontroller 220. The gate generator 226 utilizes the output of reference crystal oscillator 230 to create identically-sized gates, which will be an integer multiple of the sample time (time to next sample) or time between successive wavefront count reporting events. The temperature sensor 240 may provide temperature information to the gate generator 226 to assure that the reference signal from reference crystal oscillator 230 is properly used to generate equally-sized and timed gates.

The present invention can use any integral number x of gates from 2 to infinity; however, the gate times must be an integer multiple of the sample time (the time between counter-reporting events) i.e., GT=ST*x. Also the ending time of one gate must be the exact same starting time (therefore, have the exact same number on the wavefront counter) of the next successive non-overlapping gate.

The counter with overlap 224 is unique to the present invention as it utilizes multiple gates which overlap. The output of counter with overlap 224 will be similar to prior art counters; however, the method of generating that output will be different and will depend on the number of gates chosen. The number of registers or memory locations used to store period counter reports also depend on the number of gates chosen. The counter will be constructed to operate by continuously counting the number of wavefronts or zero-crossing points and report the constantly increasing number at predetermined intervals which will be the ST. These reports will be temporarily stored in at least x+1 registers where x is the number of overlapping gates. Counter with overlap 224 will output the difference between the current wavefront counter report and the report from x sample times previous.

Loop/filter controller 222 will be similar to prior art loop control logic in that it operates with a known ST. The difference will be that the quality or confidence level of accuracy of each sample being used will be higher than would be available if only non-overlapping gates were used. Loop/filter controller 222 will also use information from the temperature sensor 240 to make adjustments to drive the VCXO 210 to have the desired output on Reference Signal Output 212.

The explanations and illustrations presented herein are intended to acquaint others skilled in the art with the invention, its principles, and its practical application. Those skilled in the art may adapt and apply the invention in its numerous forms, as may be best suited to the requirements of a particular use. Accordingly, the specific embodiments of the present invention as set forth are not intended as being exhaustive or limiting of the invention. The scope of the invention should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes.

We claim:

1. A frequency reference comprising:
   a. a VCXO for providing an output signal to be utilized by electronic communication equipment and providing a frequency reference signal to be analyzed;
   b. a microcontroller configured to provide periodic VCXO control commands at a predetermined sample time;
   c. a reference crystal oscillator for generating a signal to be used in controlling said VCXO;
   d. a temperature sensor for providing temperature information used internal to said frequency reference;
   e. said microcontroller further configured with:
      i. a gate generator for generating a plurality of identical duration gates which are an integer multiple of the sample time;
      ii. a counter with overlap configured for;
         1. making periodic measurements of an input signal, which measurements are separated in time by the sample time; and
         2. making a comparison of a measurement taken at a terminal end of one of said plurality of identical duration gates with a measurement of said frequency reference signal taken at an initial end of said one of said plurality of identical duration gates, and generating an output which is representative of said comparison;
      iii. A loop/filter controller configured for controlling said VCXO with the aid of said output.

2. The system of claim 1 further comprising:
   a plurality of memory locations for temporarily storing said periodic measurements of said input signal wherein said plurality of memory locations is at least one more than said integer of said integer multiple of the sample time.

3. The system of claim 2 wherein said periodic measurements are incrementing counts of wavefronts of said frequency reference signal.

4. The system of claim 2 wherein said output is representative of a measured frequency of said frequency reference signal.

5. The system of claim 1 wherein said temperature sensor provides information to said gate generator and to said loop/filter controller.

6. A system of controlling a system comprising:
   a. means for providing an input signal to be analyzed, wherein said system is a frequency reference, and said input signal is a frequency reference signal which is being manipulated to be at a predetermined frequency, and means for storing measurements of said input signal, wherein said periodic measurements are incrementing counts of wavefronts of said input signal;
   b. means for making, over a plurality of identical duration gate times, periodic measurements of said input signal which are separated in time by a sample time where each of said plurality of gate times is an integer multiple of the sample time;
   c. means for making a comparison after every measurement of said input signal to a previous measurement of said input signal that was measured at one gate time previously and generating a report which is representative of said comparison;
   d. means for using said report to control a parameter of the system;
   e. means for providing an oscillator reference signal with known thermal performance characteristics;
   f. means for utilizing said oscillator reference signal to generate a plurality of equally-sized gates equal in duration to said gate time; and
   g. where said report is representative of said comparison for one of said plurality of equally sized gates;
   wherein said report is representative of a measured frequency of said frequency reference signal;

further comprising:

means for providing environmental temperature information regarding the means for providing an oscillator reference signal;

means for making a plurality of identical duration gate times:

wherein said means for making a plurality of identical gate times cooperates with a Look up table means which is populated with predetermined thermal performance data for said means for providing an oscillator reference signal.

\* \* \* \* \*